United States Patent
Hideo et al.

(10) Patent No.: US 10,203,823 B2
(45) Date of Patent: Feb. 12, 2019

(54) BUILT-IN TOUCH DISPLAY PANELS BASING ON ORGANIC LIGHT EMITTING DEVICES (OLEDS)

(71) Applicant: Wuhan China Star Optoelectronics Technology Co., Ltd., Wuhan, Hubei (CN)

(72) Inventors: Hirayama Hideo, Guangdong (JP); Nagai Hajime, Guangdong (JP)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 205 days.

(21) Appl. No.: 15/327,779

(22) PCT Filed: Jan. 7, 2017

(86) PCT No.: PCT/CN2017/070522
§ 371 (c)(1),
(2) Date: Jan. 20, 2017

(87) PCT Pub. No.: WO2018/120287
PCT Pub. Date: Jul. 5, 2018

(65) Prior Publication Data
US 2018/0211998 A1  Jul. 26, 2018

(30) Foreign Application Priority Data
Dec. 26, 2016  (CN) .................. 2016 1 12182955

(51) Int. Cl.
*G06F 3/044* (2006.01)
*G06F 3/041* (2006.01)
(Continued)

(52) U.S. Cl.
CPC ............ *G06F 3/044* (2013.01); *G06F 3/0412* (2013.01); *H01L 27/323* (2013.01);
(Continued)

(58) Field of Classification Search
CPC .................. G06F 3/044; G06F 3/0412; G06F 2203/04111; G06F 2203/04103;
(Continued)

(56) References Cited

U.S. PATENT DOCUMENTS

2014/0253502 A1* 9/2014 Cho .................. G06F 3/0412
345/174
2016/0111481 A1* 4/2016 Jeong .................. H01L 27/3248
257/40
(Continued)

FOREIGN PATENT DOCUMENTS

CN 102541333 A  7/2012
CN 104409469 A  3/2015

*Primary Examiner* — Darlene M Ritchie
(74) *Attorney, Agent, or Firm* — Andrew C. Cheng

(57) ABSTRACT

The present disclosure relates to a built-in touch display panel basing on OLED includes: a thin film transistor (TFT) layer, an anode layer, an OLED layer, and a cathode layer are configured along a bottom-to-up direction; and the cathode layer includes a plurality of first cathode blocks and the second cathode blocks, wherein the first cathode blocks and the second cathode blocks are interleaved with each other along a horizontal direction and along a vertical direction of the display panel, the adjacent first cathode blocks are electrically connected, and the adjacent second cathode blocks are electrically connected. In this way, the built-in touch display panel basing on OLED may be obtained by simple manufacturing process having the low cost and high yield rate.

6 Claims, 2 Drawing Sheets

(51) Int. Cl.
　　　*G02F 1/1333*　　(2006.01)
　　　*H01L 27/32*　　(2006.01)
　　　*H01L 51/52*　　(2006.01)

(52) U.S. Cl.
　　　CPC ...... *H01L 27/3276* (2013.01); *H01L 51/5221* (2013.01); *G02F 1/13338* (2013.01); *G06F 2203/04103* (2013.01); *G06F 2203/04111* (2013.01); *H01L 51/5206* (2013.01)

(58) Field of Classification Search
　　　CPC .............. H01L 27/323; H01L 27/3276; H01L 51/5221; H01L 51/5206; G02F 1/13338
　　　See application file for complete search history.

(56) References Cited

U.S. PATENT DOCUMENTS

| | | | |
|---|---|---|---|
| 2016/0252996 A1 | 9/2016 | Jiang | |
| 2016/0291790 A1* | 10/2016 | Yao | G06F 3/0418 |
| 2017/0003800 A1* | 1/2017 | Zhu | G06F 3/0412 |
| 2017/0010734 A1* | 1/2017 | Liu | G06F 3/044 |
| 2017/0075452 A1* | 3/2017 | Kim | G06F 3/044 |
| 2017/0090634 A1* | 3/2017 | Yang | G06F 3/0412 |
| 2017/0329443 A1* | 11/2017 | Wang | H01L 21/77 |
| 2018/0059869 A1* | 3/2018 | Ma | G06F 3/0412 |
| 2018/0095566 A1* | 4/2018 | Lee | G06F 3/0412 |

\* cited by examiner

BUILT-IN TOUCH DISPLAY PANELS BASING ON ORGANIC LIGHT EMITTING DEVICES (OLEDS)

BACKGROUND OF THE INVENTION

1. Field of the Invention

The present disclosure relates to liquid crystal display technology, and more particularly to a built-in touch display panel basing on OLED.

2. Discussion of the Related Art

Conventionally, Organic Light Emitting Display (OLED) display panels are not provided with touch function. To enable the touch function, a first metal layer and a second metal layer are arranged on the OLED display panel in sequence. The first metal layer and the second metal layer are insulated by an insulation layer, wherein the first metal layer operates as a driving electrode, and the second metal layer operates as a sensing electrode. The touch function may be implemented by the driving electrode and the sensing electrode.

However, when the touch function is realized by the conventional solution, additional electrode layers and the insulation layer are configured, which results in higher cost, more complicated manufacturing process, and lower yield rate.

SUMMARY

The present disclosure relates to a built-in touch display panel basing on OLED, wherein the touch function may be realized without introducing additional electrode layer and/or the insulation layer.

In one aspect, a built-in touch display panel basing on organic light emitting displays (OLEDs) includes: a thin film transistor (TFT) layer, an anode layer, an OLED layer, and a cathode layer are configured along a bottom-to-up direction; the cathode layer includes a plurality of first cathode blocks and the second cathode blocks, wherein the first cathode blocks and the second cathode blocks are interleaved with each other along a horizontal direction and along a vertical direction of the display panel, the adjacent first cathode blocks are electrically connected, and the adjacent second cathode blocks are electrically connected; wherein the cathode layer further includes a plurality of dividing blocks arranged between the first cathode blocks and the second cathode blocks; and the thin-film transistor (TFT) array layer includes at least one conductive layer, wherein the conductive layer is configured with a plurality of conductive bridges, the adjacent second cathode blocks are electrically connected via the corresponding conductive bridges.

Wherein cross-sections of the division blocks are reverse-cone-shaped.

Wherein tops of each of the division blocks comprise a specific pattern extending toward the first cathode block and toward another adjacent first cathode block such that the two first cathode blocks are electrically connected on the cathode layer.

Wherein the conductive bridge passes through the anode layer and the OLED layer to contact directly with two corresponding second cathode blocks.

Wherein the conductive bridges are formed by signal lines of the conductive layer.

Wherein shapes and the dimensions of the cross-sections of the first cathode blocks and the second cathode blocks are the same.

Wherein cross-sections of the first cathode blocks and the second cathode blocks are rectangular.

Wherein a minimum distance between the adjacent first cathode block and the second cathode block is defined as a sub-pixel distance.

In another aspect, a built-in touch display panel basing on organic light emitting displays (OLEDs) includes: a thin film transistor (TFT) layer, an anode layer, an OLED layer, and a cathode layer are configured along a bottom-to-up direction; the cathode layer includes a plurality of first cathode blocks and the second cathode blocks, wherein the first cathode blocks and the second cathode blocks are interleaved with each other along a horizontal direction and along a vertical direction of the display panel, the adjacent first cathode blocks are electrically connected, and the adjacent second cathode blocks are electrically connected.

Wherein the cathode layer further includes a plurality of dividing blocks arranged between the first cathode blocks and the second cathode blocks.

Wherein cross-sections of the division blocks are reverse-cone-shaped.

Wherein tops of each of the division blocks comprise a specific pattern extending toward the first cathode block and toward another adjacent first cathode block such that the two first cathode blocks are electrically connected on the cathode layer.

Wherein the thin-film transistor (TFT) array layer includes at least one conductive layer, wherein the conductive layer is configured with a plurality of conductive bridges, the adjacent second cathode blocks are electrically connected via the corresponding conductive bridges.

Wherein the conductive bridge passes through the anode layer and the OLED layer to contact directly with two corresponding second cathode blocks.

Wherein the conductive bridges are formed by signal lines of the conductive layer.

Wherein shapes and the dimensions of the cross-sections of the first cathode blocks and the second cathode blocks are the same.

Wherein cross-sections of the first cathode blocks and the second cathode blocks are rectangular.

Wherein a minimum distance between the adjacent first cathode block and the second cathode block is defined as a sub-pixel distance.

In view of the above, the cathode layer is divided into a plurality of first cathode blocks and a plurality of second cathode blocks, wherein the first cathode 141 and the second cathode blocks are interleaved with each other along a horizontal direction and along a vertical direction of the display panel. The adjacent first cathode blocks are electrically connected to each other, and the adjacent second cathode blocks are electrically connected to each other. In this way, the touch function may be realized without introducing additional electrode layer and/or the insulation layer. In addition, the built-in touch display panel basing on OLED may be obtained by simple manufacturing process having the low cost and high yield rate.

DETAILED DESCRIPTION OF THE EMBODIMENTS

Embodiments of the invention will now be described more fully hereinafter with reference to the accompanying drawings, in which embodiments of the invention are shown.

Figure 1:
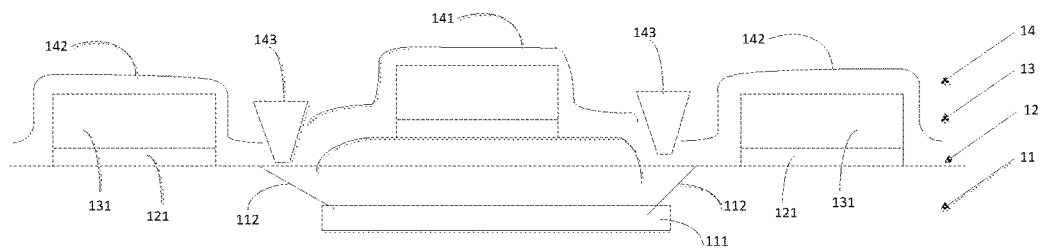
FIG. 1 is a cross-sectional view of the built-in touch display panel basing on OLED in accordance with one embodiment.
Figure 2:
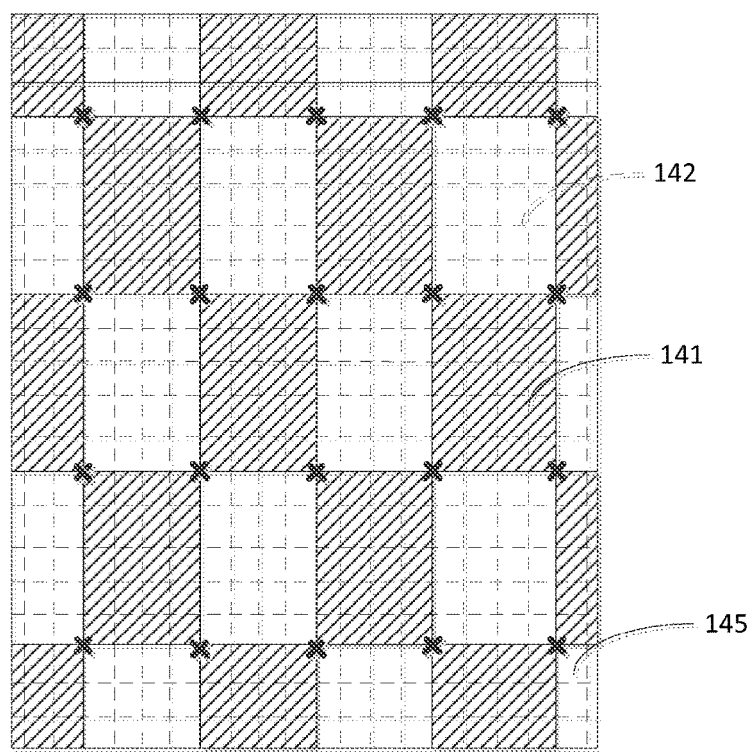
FIG. 2 is a schematic view of the built-in touch display panel basing on OLED of FIG. 1.
Figure 3:
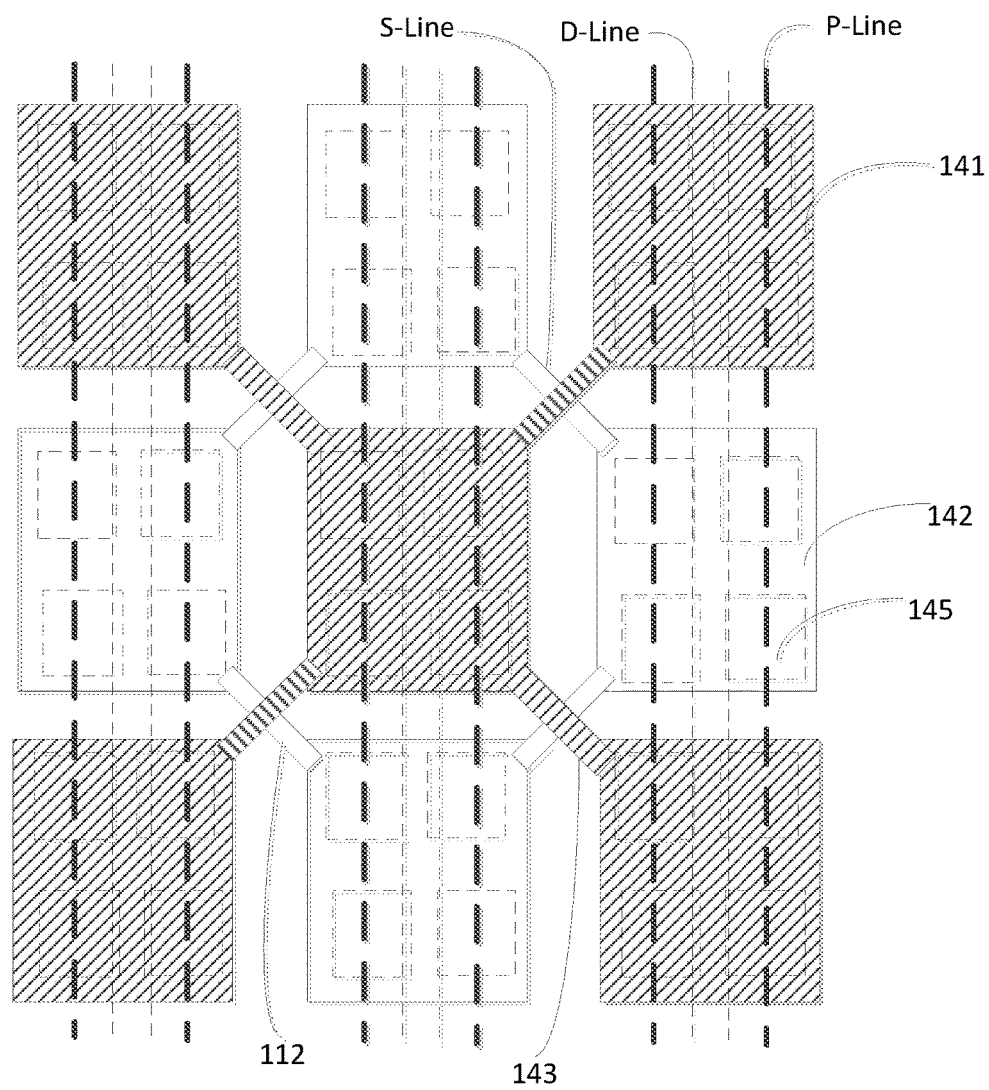
FIG. 3 is an enlarged view of the built-in touch display panel basing on OLED of FIG. 2.

FIG. 1 is a cross-sectional view of the built-in touch display panel basing on OLED in accordance with one embodiment. FIG. 2 is a schematic view of the built-in touch display panel basing on OLED of FIG. 1. FIG. 3 is an enlarged view of the built-in touch display panel basing on OLED of FIG. 2.

As shown in FIGS. 1-3, the display panel is configured with a thin film transistor (TFT) array layer 11, an anode layer 12, an OLED layer 13, and a cathode layer 14 along a bottom-to-up direction.

The cathode layer 14 includes a plurality of first cathode blocks 141 and a plurality of second cathode blocks 142, wherein the first cathode blocks 141 are insulated from the second cathode blocks 142. The first cathode blocks 141 and the second cathode blocks 142 are interleaved with each other along a horizontal direction and along a vertical direction of the display panel. Preferably, shapes and the dimensions of the cross-sections of the first cathode blocks 141 and the second cathode blocks 142 are the same.

In the embodiment, the shape of the cross-sections of the first cathode blocks 141 and the second cathode blocks 142 are rectangular. The cross-sections of the first cathode blocks 141 and the second cathode blocks 142 cover the whole sub-pixel 145. A sub-pixel gap is the minimum distance between the adjacent first cathode block 141 and the second cathode block 142. In real scenario, the sub-pixel gap is about 10 micrometers. It can be understood that the minimum distance between the adjacent first cathode block 141 and the second cathode block 142 may reach the sub-pixel distance such that the touch precision of the display panel may be enhanced by increasing the density of the first cathode blocks 141 and the second cathode blocks 142.

Preferably, the cathode layer 14 further includes a plurality of division blocks 143 dividing the cathode layer 14 to be the first cathode blocks 141 and the second cathode blocks 142. In the embodiment, the division blocks 143 are arranged between the first cathode blocks 141 and the second cathode blocks 142, and the cross-section of the division blocks 143 are reverse-cone-shaped. In other embodiments, the division blocks 143 may be of the shape other than the reverse-cone-shaped.

In the embodiment, the adjacent first cathode blocks 141 electrically connect to each other. Specifically, in addition to the edge portions of the display panel, four division blocks 143 are configured to surround the first cathode block 141. Preferably, when the first cathode block 141 is rectangular-shaped, the four division blocks 143 are arranged at four corners of the first cathode block 141. The first cathode block 141 electrically connects to four adjacent first cathode blocks 141 via the four division blocks 143. Tops of each of the division blocks 143 include a specific pattern extending toward one corner of the first cathode blocks 141 and the closest corner of another first cathode block 141 such that the two first cathode blocks 141 are electrically connected on the cathode layer 14.

In the embodiment, the adjacent second cathode blocks 142 are electrically connected. The TFT array layer 11 includes at least one conductive layer 111, wherein the conductive layer 111 is configured with a plurality of conductive bridges 112. The adjacent second cathode blocks 142 are electrically connected via the corresponding conductive bridges 112. Preferably, the conductive bridge 112 passes through the anode layer 12 and the OLED layer 13 to contact directly with two corresponding second cathode blocks 142. In another aspect, the conductive bridges 112 are not covered by the anode layer 12 and the OLED layer 13. That is, the anode layer 12 is divided into a plurality of anode blocks 121 by the conductive bridges 112, and the anode blocks 121 are spaced apart from each other. The OLED layer 13 is divided into a plurality of OLED blocks 131 by the conductive bridges 112, and the OLED blocks 131 are spaced apart from each other. The conductive bridges 112 pass through the gap between the anode blocks 121 and the gap between the OLED blocks 131 to directly contact with the two corresponding second cathode blocks 142.

In the embodiment, in addition to the edge portion of the display panel, four conductive bridges 112 are configured to surround one second cathode block 142. Preferably, when the second cathode blocks 142 is rectangular-shaped, four conductive bridges 112 are arranged at four corners of the second cathode blocks 142. One end of the four conductive bridges 112 connects to four corners of the second cathode blocks 142. The other end of the four conductive bridges 112 respectively connects to the four closest corners of other adjacent second cathode blocks 142 such that the adjacent second cathode blocks 142 are electrically connected on the conductive layer 111.

Preferably, when the display panel is the OLED display panel of a top-gate type, the conductive bridges 112 are formed by signal lines (S-Line) of the conductive layer 111 of the TFT array layer 11, wherein the signal lines (S-Line) are made by SD materials. In addition, to avoid short connections, the data lines (D-Line) and power lines (P-Line) on the same conductive layer 111 detour with respect to the conductive bridges 112. That is, the data lines (D-Line) and power lines (P-Line) surround the conductive bridges 112.

In the embodiment, the first cathode block 141 is a driving electrode, and the second cathode block 142 is a sensing electrode. In other embodiment, the first cathode block 141 may be the sensing electrode, and the second cathode block 142 may be the driving electrode.

In real scenarios, the display function and the touch function of the display panel are executed on different time, wherein the TFT array layer 11, the anode layer 12, the OLED layer 13, and the cathode layer 14 cooperatively operate with each other to display images. Specifically, before the displayed time arrives, the TFT array layer 11, the anode layer 12, the OLED layer 13, and the cathode layer 14 display the images according to image display data in response to the control signals. The cathode layer 14 is configured to sense the touch. Specifically, when fingers of the user press the display panel, the coupling between the first cathode blocks 141 and the second cathode blocks 142 close to the pressed point may be affected, that is, the coupling between the sensing electrode and the driving electrode may be affected, i.e., the amount of the coupling capacitance. When the displayed time arrives, the sensing electrode issues a triggering signals, and the scanning electrode receives the signals one by one. In this way, all of the coupling capacitance between the driving electrode and the sensing electrode may be obtained. The coordination of the pressed point may be obtained by comparing the changed amount of the coupling capacitance so as to realize the touch function.

In view of the above, the cathode layer is divided into a plurality of first cathode blocks and a plurality of second cathode blocks, wherein the first cathode blocks 141 and the second cathode blocks are interleaved with each other along a horizontal direction and along a vertical direction of the display panel. The adjacent first cathode blocks are electrically connected to each other, and the adjacent second cathode blocks are electrically connected to each other. In this way, the touch function may be realized without introducing additional electrode layer and/or the insulation layer. In addition, the built-in touch display panel basing on OLED may be obtained by simple manufacturing process having the low cost and high yield rate.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A built-in touch display panel based on organic light emitting displays (OLEDs), comprising:
    a thin film transistor (TFT) layer, an anode layer, an OLED layer, and a cathode layer are configured sequentially along a bottom-to-up direction and cooperatively operate with each other to display images;
    the cathode layer comprises a plurality of first cathode blocks and a plurality of second cathode blocks, wherein the first cathode blocks and the second cathode blocks are interleaved with each other along a horizontal direction and along a vertical direction of the display panel, the adjacent first cathode blocks are electrically connected, and the adjacent second cathode blocks are electrically connected;
    the first cathode block are driving electrodes and the second cathode blocks are sensing electrodes or the second cathode blocks are driving eletrodes and the first cathode blocks are sensing electodes, so as to perform a touch function of the display panel;
    wherein the cathode layer further comprises a plurality of dividing blocks arranged between the first cathode blocks and the second cathode blocks, and cross-sections of the dividing blocks are reverse-cone-shaped;
    the thin-film transistor (TFT) array layer comprises at least one conductive layer, wherein the conductive layer is configured with a plurality of conductive bridges, the adjacent second cathode blocks are electrically connected via the corresponding conductive bridges;
    wherein four dividing blocks are arranged at four corners of each of the first cathode blocks, and each of the first cathode blocks electrically connects to four adjacent first cathode blocks via the four diving blocks; and
    wherein each of the four dividing blocks comprises a specific pattern extending toward one of the cathode blocks and toward another adjacent first cathode block such that both the first cathode blocks are electrically connected on the cathode layer.

2. The display panel as claimed in claim 1, wherein each conductive bridge passes through the anode layer and the OLED layer to contact directly with two corresponding second cathode blocks.

3. The display panel as claimed in claim 2, wherein the conductive bridges are formed by signal lines of the conductive layer.

4. The display panel as claimed in claim 1, wherein shapes and the dimensions of the cross-sections of the first cathode blocks and the second cathode blocks are the same.

5. The display panel as claimed in claim 4, wherein cross-sections of the first cathode blocks and the second cathode blocks are rectangular.

6. The display panel as claimed in claim 5, wherein a minimum distance between the adjacent first cathode block and the second cathode block is defined as a sub-pixel distance.

* * * * *